(12) United States Patent
Pleasant et al.

(10) Patent No.: US 7,449,876 B2
(45) Date of Patent: Nov. 11, 2008

(54) SWEPT-FREQUENCY MEASUREMENTS WITH IMPROVED SPEED USING SYNTHETIC INSTRUMENTS

(75) Inventors: Daniel Lee Pleasant, Santa Rosa, CA (US); Duaine C. Wood, Santa Rosa, CA (US); Joseph M. Gorin, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/417,753

(22) Filed: May 3, 2006

(65) Prior Publication Data

US 2007/0257660 A1  Nov. 8, 2007

(51) Int. Cl.
*G01R 23/00* (2006.01)
*H03L 7/00* (2006.01)

(52) U.S. Cl. ....................... 324/76.19; 331/4

(58) Field of Classification Search ............. 324/76.19, 324/76.12, 76.11, 76.27, 91, 603; 331/4, 331/34, 178, 177 R; 327/41, 141
See application file for complete search history.

(56) References Cited

U.S. PATENT DOCUMENTS

| | | | | |
|---|---|---|---|---|
| 3,904,959 | A | * | 9/1975 | Britton, Jr. .................. 324/601 |
| 4,041,387 | A | * | 8/1977 | Dalichow et al. ......... 324/76.62 |
| 4,660,150 | A | * | 4/1987 | Anderson et al. ............. 702/68 |
| 5,028,886 | A | * | 7/1991 | Seibel et al. .................... 331/4 |
| 5,089,782 | A | * | 2/1992 | Pike et al. ..................... 324/623 |
| 6,028,439 | A | * | 2/2000 | Arkin et al. .................. 324/765 |
| 7,043,390 | B2 | * | 5/2006 | Jones et al. .................. 702/117 |
| 7,054,358 | B2 | * | 5/2006 | Yamaguchi et al. ......... 375/226 |
| 7,093,177 | B2 | * | 8/2006 | West et al. ................... 714/738 |
| 7,174,474 | B1 | * | 2/2007 | Low ........................... 713/401 |
| 2005/0289427 | A1 | * | 12/2005 | Rivoir ........................ 714/742 |
| 2006/0069967 | A1 | * | 3/2006 | Almy et al. .................. 714/724 |
| 2006/0076958 | A1 | * | 4/2006 | Deak et al. .................. 324/418 |

\* cited by examiner

*Primary Examiner*—Vincent Q. Nguyen
*Assistant Examiner*—Hoai-An D. Nguyen

(57) ABSTRACT

A synthetic test system for swept-frequency measurements that has a clock synchronization device to enable test boxes and devices that form the synthetic test system to have a common sense of time when conducting swept-frequency tests.

20 Claims, 3 Drawing Sheets

SWEPT-FREQUENCY MEASUREMENTS WITH IMPROVED SPEED USING SYNTHETIC INSTRUMENTS

BACKGROUND OF THE INVENTION

It is often necessary and desirable to measure the signals contained within a large frequency range via a swept-frequency measurement of electrical components and circuits to identify faults, verify performance, and determine characteristics of electrical components and circuits that may be referred to as a device under test ("DUT"). An example of a swept-frequency measurement is a spur search measurement, which is often listed among the tests that take the most time to execute. Examples of electrical components and circuits that often require swept-frequency measurements may include amplifiers, transmitters, modulators, and receivers, to name but a few examples.

Swept-frequency measurements typically involve a test device or synthetic test system tuning the local oscillator ("LO") in a down-converter (or an up-converter, depending on the application) during the execution of the swept-frequency test. In either case, there are typically three known approaches to making such measurements. The first and simplest approach is to tune the frequency converter to a fixed frequency and then sample the analog signal in a digital-to-analog converter, or digitizer. A fast Fourier transform ("FFT") may then be performed on the captured data, resulting in a set of frequency-dependent data within the bandwidth of the digitizer. While this may not technically be considered a swept-frequency measurement, in the sense that the frequency of the received signal is not changing, it nevertheless yields a measurement of the signal as a function of frequency, which is typically indistinguishable from a true swept-frequency measurement.

The second known approach to swept-frequency measurements may be referred to as a "stepped" mode of operation. In this case, a frequency converter is tuned to a fixed frequency and a measurement is taken. Once the measurement occurs, the frequency converter is then tuned to a new fixed frequency and another measurement is taken. This process continues until the desired frequency range has been swept. If a digitizer and FFT processor are utilized to make the measurements, each tuning step may result in measurements over the full bandwidth of the digitizer, as in the previous approach. These measurements may then be concatenated to yield a measurement over the desired frequency range. There are typically no timing difficulties associated with this approach and it is the one most often chosen for synthetic test systems, even though these types of synthetic test system measurements have additional overhead associated with them.

The third approach to swept-frequency measurements is often referred to as a "swept" mode of operation. In the "swept" mode, a frequency converter is tuned by a continuous ramp function, resulting in a measurement frequency that changes linearly as a function of time. During this type of sweep, the digitizer takes samples of the signal at regular time intervals. As a result, each sample contains a value that reflects the strength of the signal at one particular instant in time, and that particular instant in time may in turn be related to the measurement frequency. Utilizing this mode, no FFT is needed, because the samples from the digitizer are taken directly at the desired measurement frequencies. Unfortunately, this swept-frequency measurement mode has traditionally not been available to synthetic instruments.

As mentioned above, the frequency of measurements taken in "swept" mode is determined from the measurement timing. In order to accurately determine the measurement frequency in "swept" mode, four things should be known: 1) the time at which the frequency starts to sweep, 2) the rate at which the frequency is changing, 3) the time at which the data collection starts, and 4) the sample rate of the data. The second and fourth of these are generally predetermined from a knowledge of the system, but the other two are determined at the time of the measurement. The more accurately the sweep and data collection start times (or their relationship to each other) are determined, the more accurately the measurement frequencies may be aligned with the corresponding data.

In devices such as, for example, a spectrum analyzer, an internal system controller, such as a computer, that has direct hardware connections to the digitizer and down-converter, typically initiates the sweep operation. Synchronization during the measurement sweep is typically handled by hardware trigger signals that directly connect to the various measurement subsystems (such as, for example, receiver, filter, digitizer, etc.). In a synthetic instrument, however, this approach is difficult or impractical to implement and may add considerable complexity to the system because synthetic instrument test systems typically include multiple, independent, non-integrated instruments. As a result, direct hardware synchronization between these instruments is difficult and more complex than in traditional integrated instruments. As an example, the implementation of a spectrum analyzer utilizing synthetic test instruments generally requires a down-converter, a digitizer, and a controlling computer that are all implemented as separate standalone devices. While an integrated spectrum analyzer may synchronize its internal operations utilizing internal hardware signals, and thus achieve highly accurate swept-frequency measurements, this accuracy is more difficult to achieve using synthetic test instruments, due to their lack of synchronization.

In comparing a traditional spectrum analyzer and a synthetic analyzer, it is appreciated that both "swept" and "stepped" modes of swept-frequency measurements are possible in each type of analyzer. Additionally, in "stepped" mode, each analyzer moves the LO to the next frequency and allows the frequency to settle before the measurement is taken. If it is assumed that the local oscillators are identical in the two analyzers, then there should be no difference in the LO frequency settling time. However, there will be a difference in the overhead associated with executing the frequency change and subsequent data collection, because the spectrum analyzer utilizes internal hardware signaling to coordinate the two processes, while the synthetic analyzer does not. In typical implementations, this leads to slower "stepped" mode measurements as each instrument in the synthetic analyzer is stepped to a new frequency and a measurement is performed. While "swept" mode measurements are possible utilizing synthetic instruments, without the sweep synchronization, they are capable of achieving sufficient accuracy only at greatly reduced sweep rates, making them of questionable value.

Therefore, there is a need for a system and a method that allows synthetic instrument systems to perform "swept" and "stepped" mode measurements without requiring dedicated hardware triggering between the separate synthetic instruments.

SUMMARY

A swept-frequency measurement test system is disclosed. The swept-frequency measurement test system may include a plurality of test devices each having an associated clock and a clock synchronization device in signal communication with the plurality of test devices. The plurality of test devices are capable of being in signal communication with a device under test ("DUT") and the clock synchronization device synchronizes each of the clocks in the plurality of test devices. Additionally, the plurality of test devices collect swept-frequency measurements from the DUT that is in receipt of a signal and the swept-frequency measurements are synchronized by the clock synchronization device.

In an example of operation the swept-frequency measurement test system performs a method that includes communicating between the plurality of test devices and the DUT and synchronizing each of the clocks in the plurality of test devices with a clock synchronization device where the plurality of test devices collect swept-frequency measurements from the DUT that is in receipt of the signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
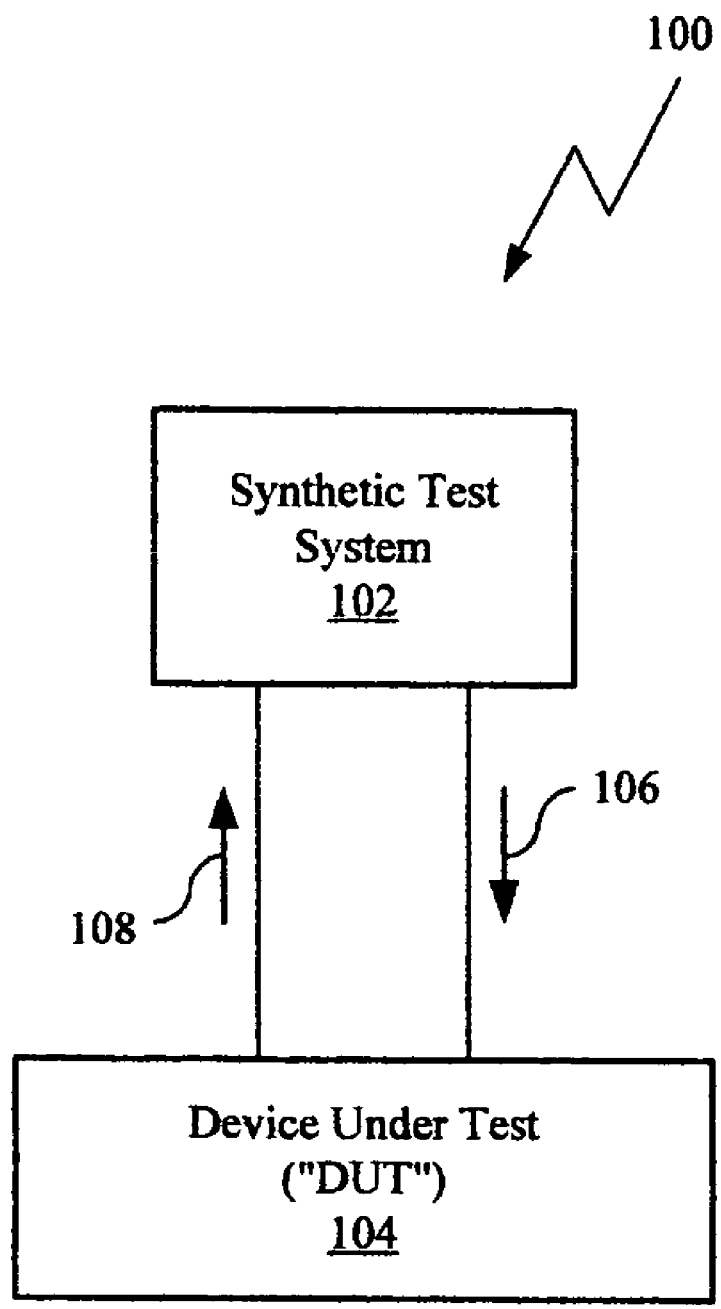
FIG. 1 is a block diagram of an example of an implementation of a synchronized synthetic test system for conducting swept-frequency measurements.

An approach for highly synchronized swept-frequency measurements is described. In FIG. 1, a block diagram 100 of an example of a synchronized synthetic test system 102 for conducting swept-frequency measurements is shown. The synthetic test system 102 may include a number of test modules that reside in independent test boxes (or test devices) or may have test modules combined in two or more test boxes or (test devices). The test devices in the synthetic test system may be in signal communication with a device under test ("DUT") 104. Typically there may be at least one signal path for injecting a signal and another signal path for obtaining measurements from the DUT. However, it is appreciated by those skilled in the art that in some test systems it is possible for the DUT 104 to generate a signal without injecting a signal from the synthetic test system 102. Returning to the example shown in FIG. 1, a signal 106 may be injected into the DUT 104 and measurements 108 may be obtained at predetermined frequency intervals that occur while conducting swept-frequency measurements. The injected signal 106 may be optionally swept or changed at the same time and rate as an analyzer sweep, or the signal source may be constant, depending upon the desired measurement and the configuration of the synthetic test system 102. As a result, the synthetic test system 102 may inject a signal 106 when in swept mode and stepped mode sweeping. Unlike known approaches, the synthetic test system 102 is synchronized with a common sense of timing, enabling the test boxes and devices of the synthetic test system 102 to be more tightly integrated. As an example, the DUT 104 may be a network transmission path, amplifier, mixer, filter, transmitter, receiver, radar subsystem, cell phone base station, or other similar types of devices.

Figure 2:
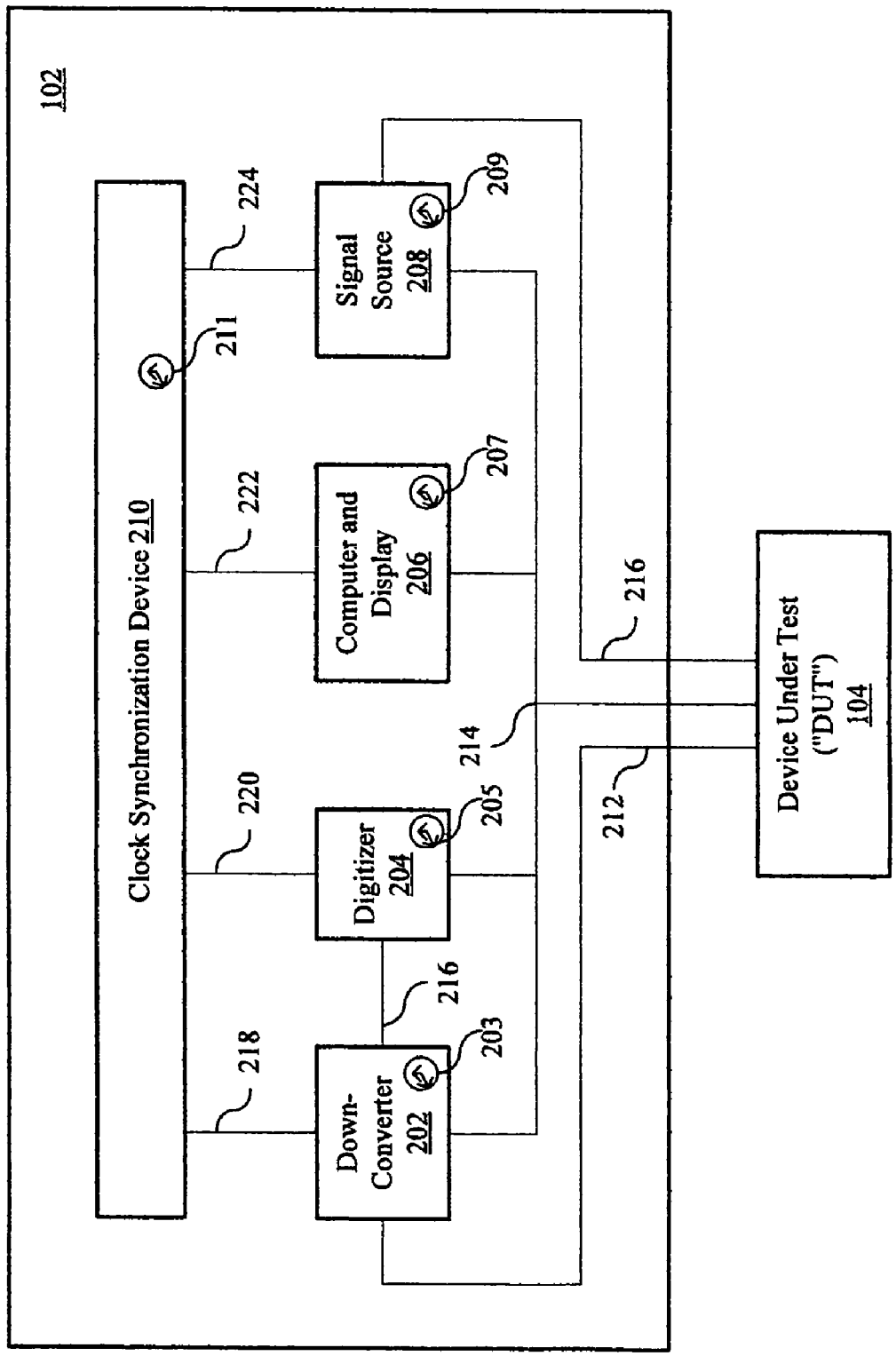
FIG. 2 is a block diagram of an example of an implementation of the synthetic test system of FIG. 1.

Turning to FIG. 2, a block diagram of the synthetic test system 102 of FIG. 1 in signal communication with a DUT 104 is shown. The synthetic test system 102 may include a number of test modules implemented in test devices, such as a down-converter 202, digitizer 204, computer and display 206, and signal source 208. The down-converter 202, digitizer 204, computer and display 206, and signal source 208 test devices may have respective clocks 203, 205, 207, and 209. The DUT 104 may be in signal communication with the down-converter 202, digitizer 204, computer and display 206, and signal source 208 via signal path 214. Additionally, the DUT 104 may be in signal communication with the down-converter 202 and the signal source 208 via signal paths 212 and 216, respectively. The down-converter 202 may also be in signal communication with the digitizer 204 via signal path 216. The signal source 208 may include a local oscillator (not shown). The synthetic test system 102 may also include a clock synchronization device 210 that may also have a clock 211 that is in signal communication to the test devices 202, 204, 206 and 208 of the synthetic test system 102 via signal paths 218, 220, 222, and 224, respectively. In other implementation examples, the module may be combined in two or more test devices.

An example of means for synchronizing timing may be the clock synchronization device 210. The clock synchronization device 210 may be a device utilizing a clock synchronization technique such as the IEEE 1588-2002 standard for clock synchronization protocol of network measurement and control systems for utilization on a local area network ("LAN"). In other implementations, other means for synchronizing timing may be utilized, such as a GPS clock signal or an oscillator signal distributed via cabling to the test devices. In this example, the IEEE 1588-2002 clock synchronization protocol may be utilized over a LAN that connects (i.e., places the LAN in signal communication with) the down-converter 202, digitizer 204, and computer and display 206 together and synchronizes their respective clocks 203, 205, 207, and 209. In other examples, the LAN may be utilized for synchronization and it may be the only means for communication between the test boxes and devices. Examples of a LAN may include TCP/IP network, Token ring network, and data communication networking protocols. Examples of a computer may include a single circuit board that functions as a controller, a personal computer that is connected to one or more hard disk drives that may have test scripts for controlling the synthetic test system 102, a keyboard, a display that is able to store and execute test procedures, or any other similar device.

Unlike previous approaches where the "stepped" mode sweep is initiated at a predetermined time with the oscillator stepping to the next frequency while allowing the frequency to settle before each measurement is taken, the current approach allows the clocks 203, 205, 207, and 209 in the different test devices 202, 204, 206, and 208 of the synthetic test system 102 to be synchronized to a common sense of timing with IEEE 1588 signaling (current version is IEEE 1588-2002) over a LAN. As a result, the waiting periods needed to let the local oscillator settle are reduced while eliminating the additional hardware typically needed for triggering. Thus, the tighter timing synchronization between the separate synthetic instrument components (i.e., the test devices 202, 204, 206, and 208) allows better coordination between the test devices, resulting in faster overall swept measurements.

In "swept" mode, a speed improvement may be achieved in the synthetic test system 102 because for a given frequency accuracy, the more accurately that the sweep and data collection timing is known, the faster the sweep may occur. The speed improvement occurs in the "swept" mode because time is directly related to frequency, and the frequency is derived from knowledge of the sweep timing that is synchronized with a common sense of timing. The improvement in "swept" mode speed is typically not from a reduction in the overhead time for making each measurement, but instead is accomplished by the frequency changing at a faster rate with the common sense of timing. In other implementations, the synchronizing timing source may be a connection to a GPS network or other timing or synchronization source.

The utilization of synchronized clocks via the clock synchronization device 210, enables each of the test devices, such as 202, 204, 206, and 208, to have their respective clocks 203, 205, 207, and 209 synchronized with a common sense of timing. The common sense of timing achieved by the clock synchronization device 210 reduces the need for special or dedicated triggering hardware in the different test boxes and devices because the test devices that are components of the synthetic test system 102 (202, 204, 206, and 208) may also be programmed or setup to begin a measurement at the exact same time.

The synthetic test system 102 may have some test devices, such as tuners, that may be required to start prior to other test devices, such as digitizers, before the synthetic test system 102 may make a measurement. This difference in start time may be the result of, for instance, the tuner having to setup a local oscillator frequency and wait for the frequency to settle and to account for filter delays, while the digitizer may be ready for operation almost instantaneously. Utilizing their own internal clocks that are synchronized to the common sense of time, the individual test devices 202, 204, 206, and 208 may proceed with their respective operations and measurements autonomously from each other.

Since the clocks 203, 205, 207, and 209 are synchronized in their respective test devices 202, 204, 206, and 208 within the synthetic test system 102, every test device 202, 204, 206, and 208 has a common sense of time. To begin a measurement in either "stepped" mode or "swept" mode, the controlling computer program is executed on the computer and display 206 and sets up the down-converter 202 to begin a frequency sweep and the digitizer 204 to begin sampling data at exactly the same time. The computer program may be a test script that communicates with the other test devices 202, 204, 208, and the DUT utilizing signal path 214. The tuner starting its local oscillator prior to the digitizer being activated may achieve this.

The signal source 208 may already be started and supplying a signal to the DUT 104 over signal path 216, or it may be started by the computer and display device 206. Alternatively, it may be programmed to start itself at the appropriate time utilizing its synchronized internal clock. The controlling computer and display 206 also initializes the down-converter to sweep through the frequency spectrum at a precise rate (typically specified in units of Hertz per second for "swept" mode, or as a dwell time for each frequency point in "stepped" mode), and it sets up the digitizer 204 to take a specified number of measurements at a rate that precisely matches the sweep rate of the down-converter 202. The down converter 202 may utilize signal path 212 to receive the measurements from the DUT 104. Similarly, the signal source 208 may optionally be set up to sweep through a frequency spectrum (which, in order to make measurements of harmonics and spurs, need not be the same frequency spectrum that the down-converter 202 will sweep through) at the same time over signal path 216. Since the clocks 203, 205, 207, and 209 in the test devices are synchronized, the test devices 202, 204, 206 and 208 need no further interaction to complete the measurement. At the completion of the frequency sweep, the controlling computer and display 206 displays and records the measured results. In other examples of implementations, other types of controllers, such as digital logic executing a state machine, may replace the computer and display 206.

Figure 3:
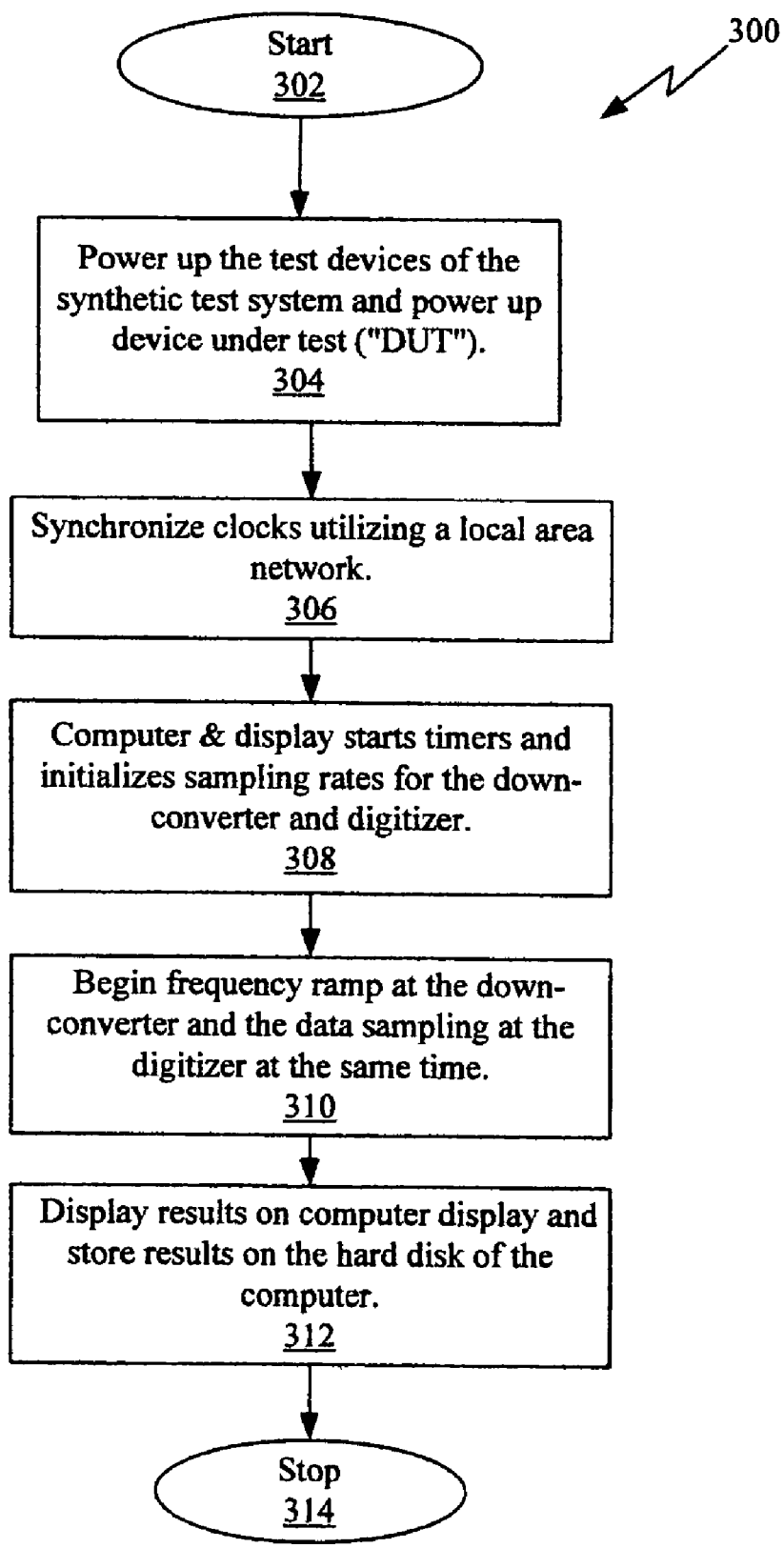
FIG. 3 is a flow diagram illustrating an example of a process performed by the operation of the synthetic test system of FIG. 1.

In FIG. 3, a flow diagram 300 illustrating an example of a process performed by the operation of the synthetic test system 102 of FIG. 1 is shown. The process starts at step 302 after the synthetic test system 102 is configured and connected to the DUT 104. In step 304, the test devices 202, 204, and 206 of the synthetic test system 102 are powered up and initialized and the DUT 104 is powered up if not previously powered on. The initialization may occur in response to execution of a test script stored on the hard disk of the computer and display 206 that initializes one or more of the test devices 202, 204, 206, and 208. The IEEE 1588 synchronization signaling over a LAN occurs between the test devices 202, 204, 206, and 208 in step 306. In step 308, the computer and display 206 initializes the start times and sampling rates for the down-converter 202 and digitizer 204. The down-converter 202 starts the frequency ramp and the data sampling at the digitizer 204 in step 310. Measurements that occur at the DUT 104 may be further processed by the computer and displayed on the display of the computer and display 206. The measurements may also be stored on one or more hard disks that are located in the computer and display 206 or that can be remotely accessed by the computer and display 206. The process ends in step 314 and the computer and display 206 outputs the results to the display, printer, plotter, magnetic media, or other similar output devices.

Furthermore, the multiple process steps implemented with a programming language, which includes an ordered listing of executable instructions for implementing logical functions, can be embodied in any machine-readable signal bearing medium for use by or in connection with an instruction execution system, apparatus, or device, such as a computer-based system, controller-containing system having a processor or controller, such as a microprocessor, digital signal processor, discrete logic circuit functioning as a controller, or other system that can fetch the instructions from the instruction execution system, apparatus, or device and execute the instructions.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A swept-frequency measurement test system, comprising:
 a plurality of test devices each having an associated clock maintaining a sense of time, where the plurality of test devices are capable of being in signal communication with a device under test ("DUT"); and
 a clock synchronization device in signal communication with the plurality of test devices, where the clock synchronization device synchronizes each of the clocks in the plurality of test devices to have a common sense of time, wherein the plurality of test devices collect swept-frequency measurements from the DUT that is in receipt of a signal, and wherein the swept-frequency measurements are synchronized by the clock synchronization device such that the test devices perform their operations autonomously from each other.

2. The swept-frequency measurement test system of claim 1, wherein the clock synchronization device synchronizes each of the clocks in the plurality of test devices to the common sense of time by means of a local area network ("LAN").

3. The swept-frequency measurement test system of claim 2, wherein the clock synchronization device utilizes IEEE 1588 signaling to provide the common sense of time to each of the plurality of test devices.

4. The test system of claim 1, wherein the test devices do not include any hardware for communicating any triggering signals between the test devices.

5. The swept-frequency measurement test system of claim 2, wherein the plurality of test devices are in signal communication exclusively over the LAN.

6. The swept-frequency measurement test system of claim 1, including a computer that is in signal communication with the clock synchronization device.

7. The swept-frequency measurement test system of claim 6, wherein the plurality of test devices includes a tuner and a digitizer.

8. The swept-frequency measurement test system of claim 6, wherein the computer further includes a hard disk attached to the computer, and a test script stored on the hard disk, and wherein the test script when executed by the computer initializes the plurality of test devices.

9. The test system of claim 7, wherein the computer controls the tuner to begin a frequency sweep at exactly the same time as the digitizer begins sampling of a signal from the DUT.

10. A method of performing swept-frequency measurements, the method comprising:

communicating between a plurality of test devices that each have an associated clock maintaining a sense of time, and a device under test ("DUT"); and synchronizing each of the clocks in the plurality of test devices to have a common sense of time with a clock synchronization device where the plurality of test devices collect swept-frequency measurements from the DUT that is in receipt of a signal.

11. The method of performing swept-frequency measurements of claim 10, wherein the step of synchronizing each of the clocks further includes signaling over a local area network ("LAN").

12. The method of performing swept-frequency measurements of claim 11, further including signaling over the LAN with IEEE 1588 signaling.

13. The method of claim 10, further comprising each of the test devices autonomously performing operations at an exact same time to perform a swept-frequency measurement of a DUT.

14. The method of performing swept-frequency measurements of claim 11, further including communicating between the plurality of test devices over the LAN.

15. The method of performing swept-frequency measurements of claim 10, further including communicating via a computer with the clock synchronization device.

16. The method of performing swept-frequency measurements of claim 15, further including accessing test scripts stored on a hard disk attached to the computer.

17. The method of claim 13, wherein the plurality of test devices includes a tuner and a digitizer, and wherein the method comprises the tuner beginning a frequency sweep at exactly the same time as the digitizer begins sampling of a signal from the DUT.

18. The method of performing swept-frequency measurements of claim 16, further including storing swept-frequency measurements on the hard disk connected to the computer.

19. The method of performing swept-frequency measurements of claim 15, further including displaying swept-frequency measurements on a display connected to the computer.

20. A swept-frequency measurement test system, comprising:

a plurality of test devices each having an associated clock maintaining a sense of time, where the plurality of test devices are capable of signal communication with a device under test ("DUT"); and a means for clock synchronization of each of the clocks coupled to the plurality of test devices so that the clocks all have a common sense of time, wherein the plurality of test devices collect swept-frequency measurements from the DUT that is in receipt of a signal, and wherein the swept-frequency measurements are synchronized by the means for clock synchronization.

* * * * *